(12) United States Patent
Meckel

(10) Patent No.: US 6,196,936 B1
(45) Date of Patent: Mar. 6, 2001

(54) COATED GOLF CLUB COMPONENT

(75) Inventor: Nathan K. Meckel, LaMesa, CA (US)

(73) Assignee: Molecular Metallurgy, Inc., El Cajon, CA (US)

( * ) Notice: Subject to any disclaimer, the term of this patent is extended or adjusted under 35 U.S.C. 154(b) by 0 days.

(21) Appl. No.: 08/901,019

(22) Filed: Jul. 25, 1997

Related U.S. Application Data

(63) Continuation-in-part of application No. 08/585,177, filed on Jan. 11, 1996, now Pat. No. 5,724,868.

(51) Int. Cl.$^7$ .............................. A63B 53/04; A63B 53/12
(52) U.S. Cl. ............ 473/349; 204/192.38; 427/255.394; 473/316
(58) Field of Search ........................... 473/349, 316–323; 425/580; 427/255.394; 204/192.38

(56) References Cited

U.S. PATENT DOCUMENTS

| | | |
|---|---|---|
| Re. 33,735 | 11/1991 | Rumble et al. . |
| 1,587,293 | 6/1926 | Fink et al. . |
| 2,908,502 | 10/1959 | Bradstreet et al. . |
| 3,988,955 | 11/1976 | Engel et al. . |
| 4,556,607 * | 12/1985 | Sastri . |
| 4,653,373 | 3/1987 | Gerber . |
| 4,933,058 | 6/1990 | Bache et al. . |
| 4,951,953 | 8/1990 | Kim . |
| 5,207,427 | 5/1993 | Saeki . |
| 5,232,568 | 8/1993 | Parent et al. . |
| 5,272,802 | 12/1993 | Stites, III . |
| 5,354,056 | 10/1994 | Cornish, III . |
| 5,431,071 | 7/1995 | Williams . |
| 5,458,334 | 10/1995 | Sheldon et al. . |
| 5,472,201 | 12/1995 | Aizawa et al. . |
| 5,472,202 | 12/1995 | Yamanaka . |
| 5,509,933 * | 4/1996 | Davidson et al. ................ 623/23.53 |
| 5,531,444 | 7/1996 | Buettner . |
| 5,618,388 * | 4/1997 | Seeser et al. ................... 204/192.12 |

FOREIGN PATENT DOCUMENTS 7-51416 * 2/1995 (JP) .

OTHER PUBLICATIONS

Herbert M. Gabriel, Vacuum Arc Discharges Used to Deposit Hard Wear Resistant Coatings onto Tools, *IEEE Trans. on Plasma Science*, vol. 21, No. 5, (Oct. 1993).
Declaration of Nathan K. Meckel and attached Press Relase of Molecular Metallurgy, Inc. dated on its face Jan. 1995.

* cited by examiner

*Primary Examiner*—Steven Wong
*Assistant Examiner*—Stephen L. Blau
(74) *Attorney, Agent, or Firm*—Gregory Garmong

(57) ABSTRACT

A golf club component is coated with a corrosion-resistant, wear-resistant, impact-resistant material, such as zirconium nitride, titanium nitride, di-titanium nitride, titanium aluminum nitride, titanium carbonitride, titanium zirconium nitride, or titanium aluminum carbonitride. Deposition is preferably accomplished by a cathodic arc process using linear deposition sources with simultaneous heating and rotation of the golf club component substrate relative to the deposition sources.

20 Claims, 4 Drawing Sheets

COATED GOLF CLUB COMPONENT

This application is a continuation-in-part of application Ser. No. 08/585,177, filed Jan. 11, 1996, U.S. Pat. No. 5,724,868 for which priority is claimed.

BACKGROUND OF THE INVENTION

This invention relates to golf clubs, and, more particularly, to golf club heads and shafts that are coated with a wear-resistant, impact-resistant, colorful coating.

A golf club includes an elongated shaft with a hand grip at one end, and a golf club head attached to the other end of the shaft. There are basically three types of clubs—the drivers, the irons, and the putters. Older-style shafts were made of wood, and current shafts are made of metal or composite materials. Golf club heads are made of wood or metals such as steel or titanium alloys. The player uses the golf club by grasping a hand grip on the shaft, swinging the club, and impacting a golf ball with the club head. At the point of impact on the club head face, the club head is subjected to large forces. The present invention deals with improving golf club heads and shafts, and golf clubs made using the improved golf club heads and shafts.

In a highly competitive golf club industry, clubs must be distinctive and functional. It is a common practice for club manufacturers to apply paints, organic coatings, or paint-like coatings, collectively termed "paints" herein, to their clubs with "signature" colors and/or patterns that allow the easy identification of the clubs and their association with the manufacturer. The paints also protect the clubs against corrosion.

A major trend in the golf industry is to the use of titanium club heads for metal woods and titanium shafts in some applications. Paints do not, as a general rule, adhere well to titanium. Some manufacturers therefore clear coat the titanium heads with an organic coating and others apply a three-layer coating of primer, pigmented coatings, and clear overcoat. But, even then, the paint applied to the club head face may quickly chip or be worn away after only a few strokes. Even scraping the club head against gravel, sand, or other objects may damage the paint. When the paint is damaged, the protection of the paint is lost, and the customer, who may have paid a substantial amount for the club, may have the perception of an inferior-quality club.

In an attempt to overcome this problem, the quality and toughness of paints have been improved over the years, and painting techniques have also improved. Surface treatments other than paints have been developed, such as ceramic coatings for titanium club heads. While such surface treatments yield improvements, it is difficult to impart to them the color and other features of paints.

There is therefore a need for an improved approach to the protection of metallic golf club heads that is both decorative and functional. The same need is found for metallic shafts. The present invention fulfills this need, and further provides related advantages.

SUMMARY OF THE INVENTION

The present invention provides a golf club head and/or shaft and a golf club that are protected by a coating. The coating is hard, durable, wear-resistant, and corrosion-resistant. It adheres well to all metals with which it has been tested, and in particular it adheres well to steel and titanium alloys, as well as other alloys. The coefficient of friction of the coating is low, so that it tends to impart little if any side spin to the golf ball at the moment of impact, reducing the likelihood of a hooked or sliced drive. By varying its composition and application parameters, the color of the coating may be varied over a substantial range, which includes the signature colors of many golf club component and golf club manufacturers.

In accordance with the invention, a golf club component comprises a golf club head substrate made of a substrate material having a surface, and a coating overlying and contacting at least a portion of the surface of the golf club head substrate. The golf club component may be a club shaft or a club head. The coating comprises at least one homogeneous layer of a coating material including a metal selected from the group consisting of vanadium, chromium, zirconium, titanium, niobium, molybdenum, hafnium, tantalum, and tungsten, and a nonmetal selected from the group consisting of nitrogen and carbon.

The coating is preferably applied using a physical vapor deposition source such as a cathodic arc source and a controlled atmosphere of the nonmetal. Other operable techniques such as magnetron sputtering may also be used.

To enhance the quality of the coating and its adherence to the substrate surface, the coating is preferably applied as two or more discrete layers of different compositions, but wherein each layer is substantially homogeneous and of uniform composition throughout. For example, in a preferred case wherein the coating is titanium carbonitride, the coating has a first layer of titanium contacting the substrate surface, a second layer of titanium nitride overlying the first layer, and a third layer of titanium carbonitride overlying the second layer. This multilayer approach improves the durability of the coating and reduces the possibility of exposure of any of the underlying substrate through micropores in the coating. The total thickness of the coating is preferably from about 1-½ to about 10 micrometers, most preferably about 1-½ to about 5 micrometers. Thin layers of metal may be deposited between the hard layers to provide internal stress relief in the coating, particularly when the total thickness of the coating is greater than about 5 micrometers, thereby prolonging its adherence to the substrate and its life. By varying the ratios and amounts of the nitrogen-containing source (e.g., nitrogen) and the carbon-containing source gas (e.g., acetylene), the color of the titanium carbonitride coating top layer may be varied from pink, for a low acetylene content, through intermediate purple, copper, and red colors, to nearly black, for a high acetylene content. Variations in the compositions of other coatings to be discussed herein yield color variations within other ranges of color.

The coating on the surface of the substrate is hard, wear-resistant, and corrosionresistant. The coating may be optionally further improved by sealing the surface with a sealant such as polytetrafluoroethylene that resides within any micropores. Because it resides within the micropores, if any, the sealant is not contacted by any wearing medium when in service.

The present invention provides a golf club head and shaft that are fully functional and whose dimensions and weight are not substantially changed by the coating operation, inasmuch as the coating is preferably much less than ¹⁄₁₀₀₀ of an inch thick. The golf club component may therefore be fabricated to substantially its desired size, and then processed according by the present approach. The final product is hard and durable, and corrosion resistant in media commonly encountered by the club component. The coating has a distinctive color which is determined by the selected composition. The color is inherent in the coating composition, and therefore does not quickly wear or chip away as in the case of paint-like coatings.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 5A–C is a series of enlarged cross sectional views of the side of the golf club of FIG. 1, taken along lines 5—5, wherein FIG. 5A shows a first embodiment, FIG. 5B shows a second embodiment, and FIG. 5C shows a third embodiment.

DETAILED DESCRIPTION OF THE INVENTION

Figure 1:
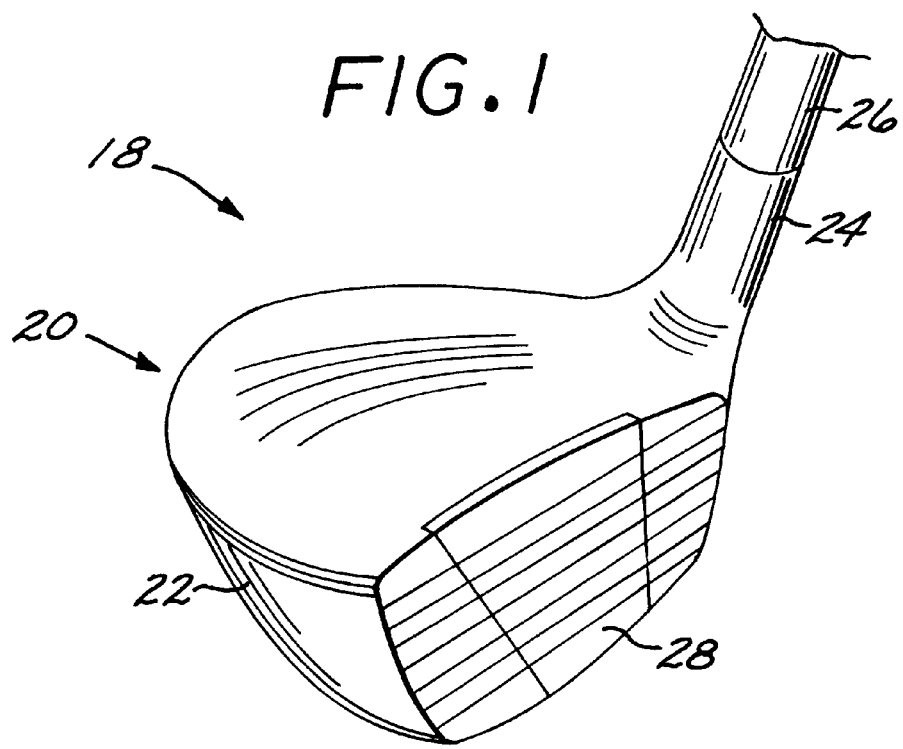
FIG. 1 is a perspective view of a metal wood golf club head.

FIG. 1 depicts a golf club 18 having a golf club head 20 with a body 22 and a hosel 24 extending upwardly from the body 22 of the club head 20. The drawing depicts a metal wood head 20, but the invention is applicable to other clubs such as irons and putters as well. A shaft 26 is fastened to the golf club head 20 at the hosel 24. The body 22 of the golf club head 20 includes a striking surface 28, which may be integral with the remainder of the body 22 or may comprise a face-plate insert of a different material that is affixed to the remainder of the body 22. The coating of the present invention is preferably applied to the entire golf club head 20, or it may be applied only to selected portions of the head. The golf club head 20 is typically cast in two pieces which are joined together and heat treated to an acceptable structure and strength. Such processing is well known in the art for each type of material and does not form part of the present invention. The shaft 26 may be made by any operable process, such as drawing for a metallic shaft or flag rolling for a composite shaft.

Figure 3:
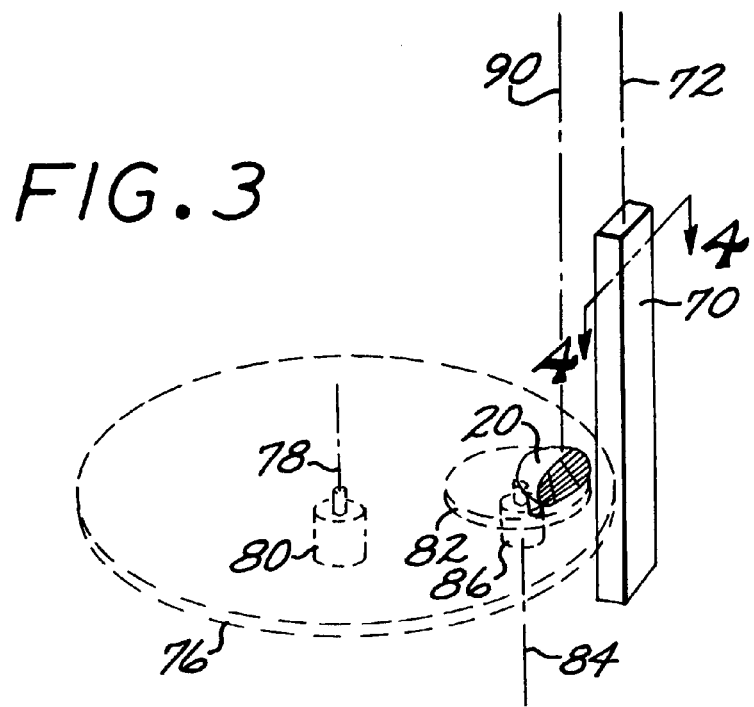
FIG. 3 is a schematic perspective view of a detail of the deposition apparatus of FIG. 2.
Figure 2:
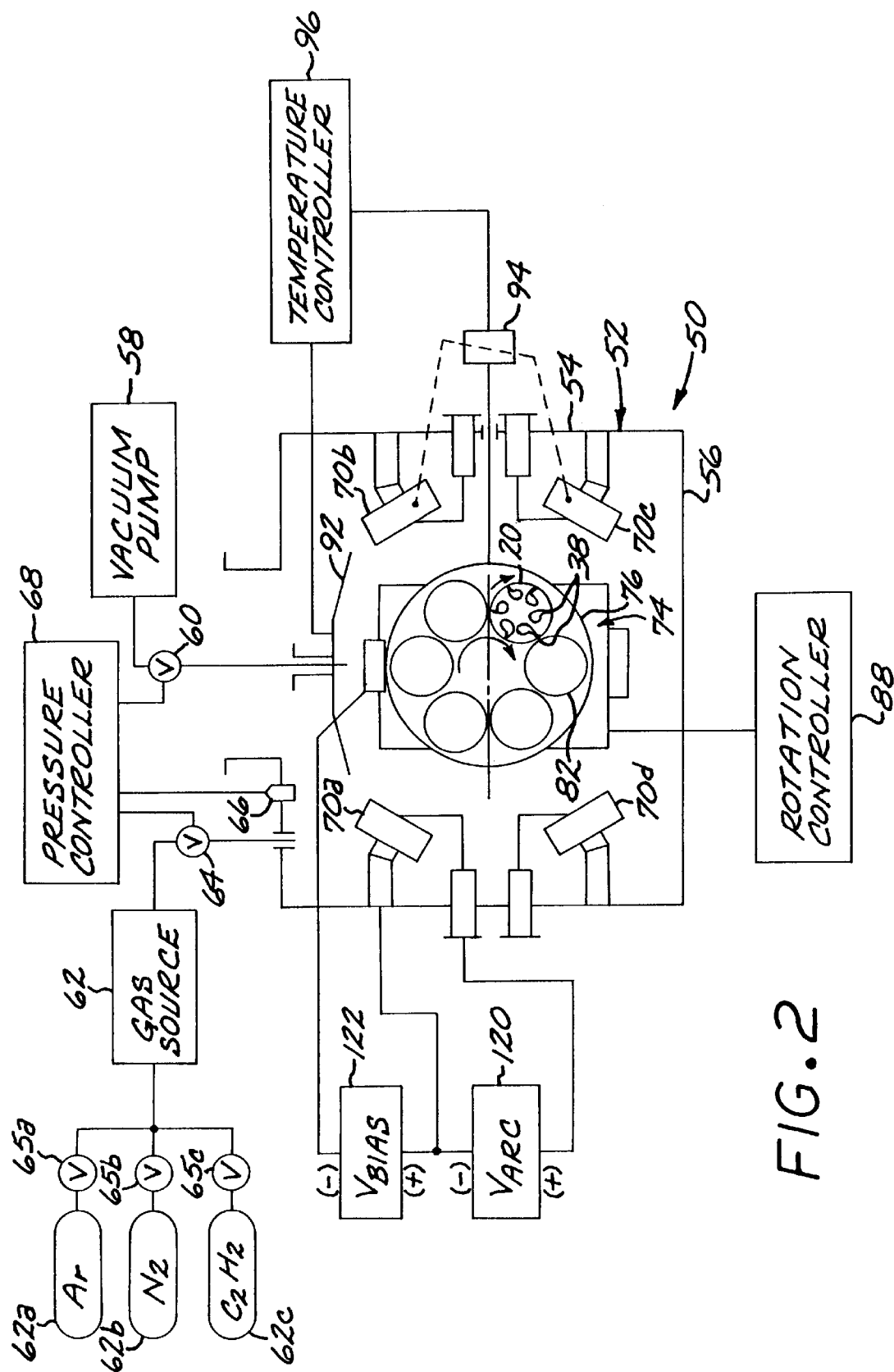
FIG. 2 is a schematic plan view and control diagram of a deposition apparatus used in conjunction with the invention.
Figure 4:
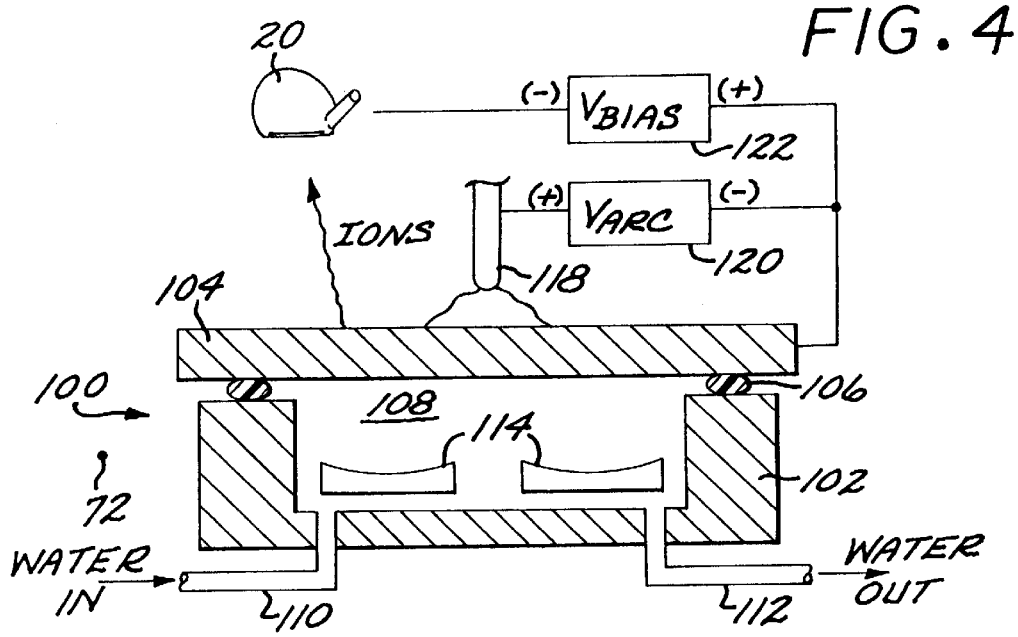
FIG. 4 is a schematic sectional view of a preferred cathodic arc source, taken along lines 4—4 of FIG. 3.

FIGS. 2 and 3 depict a preferred deposition apparatus 50 used to treat the golf club head 20 by applying a coating, although other operable deposition apparatus may be used. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 pumping through a gate valve 60. The vacuum pump 58 includes a mechanical pump and a diffusion pump operating together in the usual manner. The interior of the chamber 52 may be controllably backfilled to a partial pressure of a selected gas from a gas source 62 through a backfill valve 64. The gas source typically includes several separately operable gas sources. The gas source 62 usually includes a source 62a of an inert gas such as argon, a source 62b of nitrogen gas, and a source 62c of a carbon-containing gas such as acetylene. Each source provides its gas selectively and independently through a respective selector valve 65a, 65b, or 65c. Other types of gas can also be provided as desired.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gage 66. Thus, the gaseous backfilled atmosphere within the chamber 52 is preferably a flowing or dynamic atmosphere.

At least two, and preferably four as shown, linear deposition sources 70 are mounted within the interior of the chamber 52 in a circumferentially spaced-apart manner. In FIG. 3, the four deposition sources are identified as distinct sources 70a, 70b, 70c, and 70d, as they will be addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate during deposition procedures.

A substrate support 74 is positioned in the chamber 52. The substrate support 74 produces a compound rotational movement of a substrate mounted thereon. The preferred substrate support 74 includes a rotational carriage 76 that rotates about a rotational axis 78, driven by a rotational drive motor 80 below the rotational carriage 76. Mounted on the rotational carriage 76 are at least one and preferably six, as shown, planetary carriages 82. The planetary carriages 82 are rotationally driven about a rotational axis 84 by a planetary drive motor 86 below the planetary carriages 82. The speeds of the rotational drive motor 80 and the planetary drive motor 86 are controlled by a rotation controller 88.

For deposition processing, the golf club head 20 is mounted to the planetary carriage 82 with appropriate fixturing such that the hosel 24 is approximately parallel to the rotational axis 84, or a shaft 26 is mounted with the long axis of the shaft approximately parallel to the rotational axis 84. For commercial operations, multiple club heads 20 or shafts 26 are typically mounted on each planetary carriage 82 in the manner described, as illustrated for one of the planetary carriages 82. In the deposition apparatus 50, the hosel 24 or shaft 26, the source axis 72, the rotational axis 78, and the rotational axis 84 are all arranged to be approximately parallel to a common axis 90.

The temperature of the golf club heads 20 or shafts 26 during deposition is controlled using a heater 92 that extends parallel to the deposition sources 70 on one side of the interior of the chamber 52. The heater 92 is preferably a radiant heater operating with electrical resistance elements. Experience has shown that, due to the rotational movement of the carriages 76 and 82 and the heat retention capacity of the club heads 20 or club shafts 26, the single heater 92 on one side of the chamber 52 provides a sufficiently uniform heating of the substrates. The temperature of the club heads 20 or shafts 26 is monitored by a temperature sensor 94 such as an infrared sensor that views the interior of the chamber. The temperature measured by the sensor 94 is provided to a temperature controller 96 that provides the power output to the heater 92. Acting in this feedback manner, the temperature controller 96 allows the temperature of the club heads 20 or shafts 26 to be established. (The club heads or shafts are also heated to some extent by the deposition process, so that the heater acts as the fine tuning instrument to control the temperature of the club heads or shafts.) In the preferred processing of titanium or steel club heads 20 or shafts 26 with an applied titanium-containing coating, the club heads 20 or shafts 26 are heated to a temperature of from about 625° F. to about 900° F.

FIG. 5 illustrates a cathodic arc source 100 used in the preferred form of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two concavely shaped permanent magnets 114 extend parallel to the source axis 72. Positioned above the deposition target 104 exterior to the body 102 is a striker electrode 118. A voltage $V_{ARC}$ is applied between the striker electrode 118 and the deposition target 104 by an arc source power supply 120. $V_{ARC}$ is preferably from about 10 to about 50 volts.

The cationic material that initially forms the deposition target 104 is deposited onto the club head substrate 20 or shaft substrate 20, together with, if desired, gas atoms producing anionic species from the atmosphere of the chamber. In the preferred embodiment, the deposition target 104 is made of titanium (Ti), equiatomic titanium aluminide (TiAl), or zirconium (Zr). Other cationic species operable as the deposition target material include metals found in Groups IV–VI of the Periodic Table, including but not limited to vanadium, chromium, niobium, molybdenum, hafnium, tantalum, and tungsten. Other metals such as aluminum may be used. The deposition target may also be made of alloys or intermetallic compounds such as, for example, Ti—6Al—4V or $Ti_3Al$.

To accomplish the deposition, an arc is struck between the striker electrode 118 and the deposition target 104, locally heating the deposition target 104 and causing positively charged titanium or titanium aluminide ions (cations) to be ejected from the deposition target 104. (The deposition target 104 is therefore gradually thinned as the deposition proceeds.) The arc on the deposition target 104 moves in a racetrack course along the length of the deposition target 104. A negative bias voltage $V_{BIAS}$ is applied between the deposition target 104 and club head by a bias power supply 122, so that the positively charged metallic or intermetallic ions are accelerated toward the club head 20.

$V_{BIAS}$ is preferably from about –30 to about –1000 volts. The value selected for $V_{BIAS}$ determines the energy of ionic impacts against the surface of the club head, a phenomenon termed ionic peening. In a typical case, $V_{BIAS}$ is initially selected to be a relatively large negative voltage to achieve good adherence of the first metallic layer (discussed subsequently) to the club head substrate. $V_{BIAS}$ is subsequently reduced (made less negative) when overlying hard layers are deposited, to achieve a uniform fine microstructure in the layers. The values of $V_{BIAS}$ are desirably maintained as low as possible consistent with obtaining an adherent coating.

The cathodic arc source is preferred, but other types of sources such as sputtering sources may also be used.

The cooperative selection of the material of the deposition target 104 and the gases introduced into the deposition chamber from the gas source 62 allows a variety of coatings 130 to be deposited onto the golf club head 20. In all cases, the total thickness of the coating 130, for the total of all of the layers, is preferably from about 1-½ to about 10 micrometers. If the coating thickness is less than about 1-½ micrometers, the physical properties of the coating are insufficient to produce the desired results. If the coating thickness is more than about 10 micrometers, the coating has a high internal stress that leads to a tendency for the coating to crack and spall away from the golf club head 20 during deposition or during service. Preferably, the maximum thickness of the coating is no more than about 5 micrometers FIGS. 5A–5C, which are not drawn to scale, depict three coating systems 130 of interest, by way of illustrating the preferred approaches and also the types of coating structures that may be produced. The invention is not limited to these coating systems 130, however. The coating 130a of FIG. 5A includes a first layer 132 of metallic titanium (pure titanium or titanium alloy) contacting the surface of the club head 20. The first metallic layer 132 aids in adhering the overlying layer(s) to the surface of the club head substrate 20 or shaft substrate 26. The first layer 132 is preferably quite thin, on the order of from about 100 Angstroms to about 600 Angstroms thick. The first layer 132 is deposited by backfilling the deposition chamber with a small partial pressure of about 5 microns of an inert gas such as flowing argon (flowing at a rate of about 200–450 standard cubic centimeters per minute (sccm) in the apparatus used by the inventor), and then depositing titanium or an alloy from the deposition target 104 with $V_{BIAS}$ about –1000 volts. Because the argon does not chemically react with the titanium, the first layer 132 is metallic titanium (either pure titanium or a titanium alloy). A second layer 134 overlies the first layer 132. The second layer 134 is titanium nitride (TiN), which is deposited by backfilling the deposition chamber with a small partial pressure of about 5 micrometers of flowing nitrogen (flowing at a rate of about 150–500 sccm in the inventor's apparatus), and then depositing titanium from the deposition target 104 with $V_{BIAS}$ about –50 volts. The titanium cations combine with the nitrogen anions to produce the titanium nitride coating in the layer 134. The second layer 134 is of a thickness such that the total thickness of the coating 130a is from about 1-½ to about 10 micrometers, preferably from about 1-½ to about 5 micrometers.

This pattern may be continued, depositing a third layer comprising pure or alloyed titanium overlying the titanium nitride layer 134, then a fourth layer comprising titanium nitride overlying the third layer, and so on. When a titanium metallic layer is placed between two of the layers such as titanium nitride, the titanium metallic layer is typically made quite thin and is present primarily to relieve stress in the neighboring layers. The thicknesses of the layers are adjusted so that the total thickness of the coating is from about 1-½ to about 10 micrometers, preferably from about 1-½ to about 5 micrometers. Various other compositions may be substituted for one or more of these layers, as well.

Any one of the layers is, within itself, of uniformly of the indicated composition and homogeneous. That is, the layer does not include a mixture or alloy of the indicated layer material with other species such as cobalt, nickel, and the like, as disclosed in U.S. Pat. No 5,531,444.

Figure 5A:
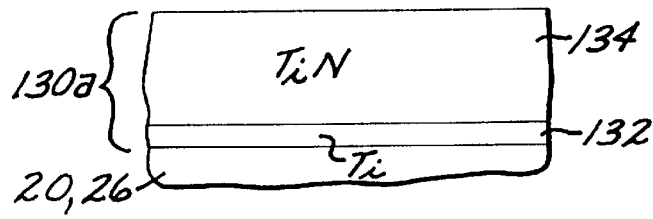
Figure 5B:
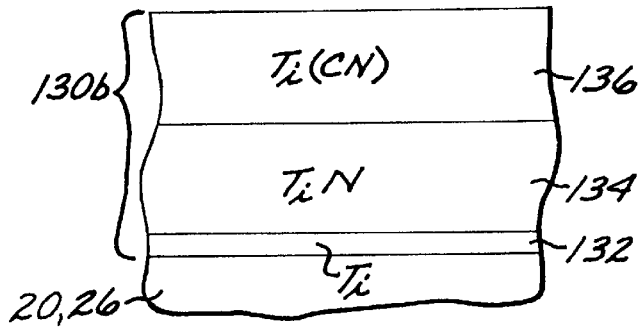

In another embodiment of a coating 130b, shown in FIG. 5B, the titanium layer 132 and the titanium nitride layer 134 are first deposited using the approach described above in relation to the coating 130a, with the layer 132 having a thickness of about 100–600 Angstroms and the layer 134 having a thickness of about ¼ to about 1 micrometer. A third layer 136 of titanium carbonitride (Ti(CN)) is deposited by backfilling the chamber with a small partial pressure of about 1–2 microns of a flowing carbon-containing gas such as acetylene (flowing at a rate of about 10–150 sccm in the inventor's apparatus) and also a partial pressure of about 3–4 microns of flowing nitrogen (flowing at a rate of about 100–300 sccm in the inventors' apparatus). The total pressure of the carbon-containing gas and nitrogen is about 5 microns. Titanium is deposited from the deposition target 104. The titanium reacts with the carbon from the carbon-containing gas and the nitrogen to deposit the titanium carbonitride third layer 136. Additional layers may be deposited as described above, if desired. The thicknesses of the individual layers are selected so that the total thickness of the coating is from about 1-½ to about 10 micrometers, preferably from about 1-½ to about 5 micrometers.

The embodiment of FIG. 5B has the advantage that the color of the titanium carbonitride top layer may be controllably varied by setting the relative amounts and flow rates of the nitrogen and the carbon-containing gas to particular values for the deposition of the layer. When the amount of carbon-containing gas is small, the titanium carbonitride approaches the titanium nitride composition, which is gold in color. With increasing amounts of the carbon-containing gas, the color becomes pink, then purple, then copper, then red, then darker red, and finally approaches black. This feature may be used to provide an adherent coating of a preselected color on the club head.

Figure 5C:
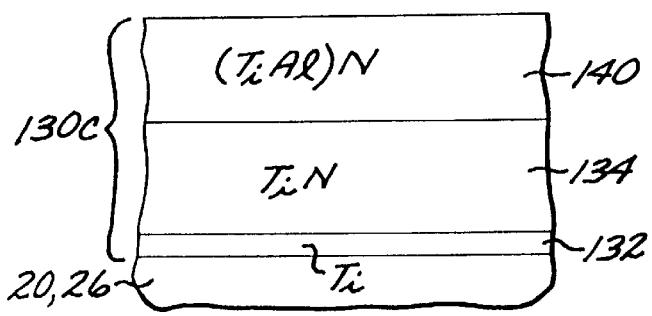

In another embodiment of a coating 130c, shown in FIG. 5C, the layers 132 and 134 are first deposited as described for the coating 130a, in respective thicknesses of about 100–600 Angstroms and about ¼ to about 1 micrometer. A third layer 140 of titanium aluminonitride ((TiAl)N) is deposited by backfilling the chamber with a small partial pressure of about 5 micrometers of flowing nitrogen (flowing at about 100–300 sccm in the inventors' apparatus), and then depositing titanium aluminide from the deposition target 104. The titanium aluminide cationic species reacts with the nitrogen anionic species to produce the third layer of titanium aluminonitride.

When a single cationic species to be deposited into the coating 130, as in the embodiments of FIGS. 5A and 5B, all of the deposition sources 70a, 70b, 70c, and 70d utilize deposition targets 104 made of that cationic species. When two cationic species such as titanium and aluminum are to be deposited, as in the embodiment of FIG. 5C, some of the deposition sources utilize titanium deposition targets and some of the deposition sources utilize alloy deposition targets such as TiAl deposition targets. For example, to deposit the coating of FIG. 5C, the deposition sources 70a and 70c are made with titanium deposition targets 104, and the deposition sources 70b and 70d are made with titanium-aluminum deposition targets 104. The pair of sources 70a and 70c is operated during deposition of the layer 132 (with inert gas in the chamber) and the layer 134 (with nitrogen gas in the chamber), and the pair of sources 70b and 70d is operated during deposition of the layer 140 (with nitrogen gas in the chamber).

The use of various layers within the coating 130 yields results of two different types. First, the mechanical and physical properties of the coating are varied according to the types, hardnesses, and thicknesses of the layers. Second, the color of the coating depends upon the layer which is exposed at the top of the coating. The color produced by this coating technique is long-lasting and will not readily spall or be worn away from the surface because of the hardness of the coating, a desirable feature because the surface of the club head 20 or club shaft 26 exhibits an attractive external appearance. For example, a zirconium nitride top coating is champagne in color but may be given a greenish tinge with excess nitrogen, a titanium nitride top coating is a golden yellow color, a titanium carbonitride coating has a controllably variable color as discussed above, a titanium aluminum nitride top coating is a lustrous gray color, a chromium nitride coating is silver in color, and a di-titanium nitride coating is silver in color. Other coatings such as titanium-aluminum carbo-nitride (TiAl)(CN) may be applied to vary the properties and color of the coating. (When shorthand abbreviations for coatings are used herein, such as TiN for titanium nitride, the shorthand is not meant to suggest that the coating must be precisely stoichiometric at the indicated composition.)

Figure 6:
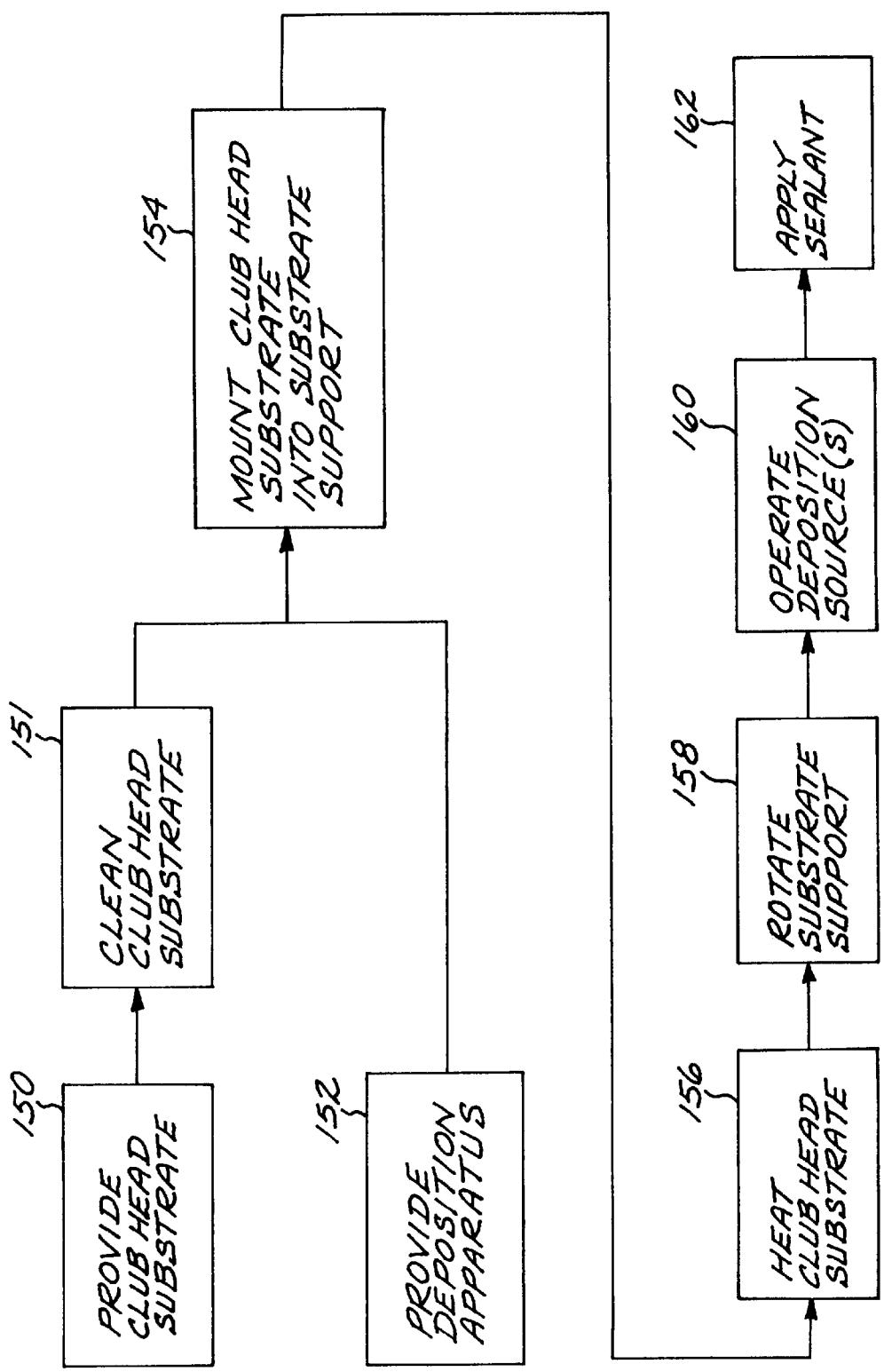
FIG. 6 is a block process flow diagram for a preferred method for preparing a golf club according to the invention.

FIG. 6 is a block flow diagram for a method of practicing the invention to produce a golf club head, the preferred application. The procedure for producing a golf club shaft is similar. A golf club head substrate is provided, numeral 150. The golf club head substrate has the form of the club head 20. The golf club head substrate is cast to the desired shape and heat treated in the conventional manner. The golf club head substrate is carefully cleaned, numeral 151, in any appropriate manner, to remove grease, dirt, and other surface contaminants. The deposition apparatus is provided, numeral 152, preferably in the form described previously. The golf club head substrate is mounted to the planetary carriage of the deposition apparatus. In a production operation, a plurality of golf club head substrates are mounted to each planetary carriage.

The heater is activated to bring the golf club head substrates to about the temperature of deposition, preferably about 625–900° F., numeral 156. As the deposition processing proceeds, the golf club head substrates are also heated by the deposition operation, so that the power to the heater may be reduced somewhat. The feedback temperature controller 96 operates to maintain the temperature at a selected setpoint value. The rotation controller 88 is activated to rotate the rotational carriage at a rate of about 1 revolution per minute (rpm) and the planetary carriage at a rate of about 1-½ rpm, numeral 158.

The deposition sources are operated to deposit the coating 130 onto the golf club head substrates, numeral 160, while the heating step 156 and the rotational step 158 continue concurrently with the deposition. As discussed in relation to FIGS. 5, the operating conditions are selected to produce the desired layers within the coating. In a typical case, the current between the striker and the deposition target for each of the cathodic arc sources is 90–150 Amperes, $V_{BIAS}$ is in the range of −30 to −600 volts, and the backfill gas pressure of inert or reactive gas is about 2–6 microns, most preferably about 5 microns. Deposition is continued for a period sufficient to deposit from about 1-½ to about 10 micrometers, preferably from about 1-½ to about 5 micrometers, total thickness of material in the coating. By way of example of typical operating times, to produce the coating of FIG. 5A, the cathodic arc sources are operated for about 1–4 minutes with an argon backfill to produce the first layer 132 and then for about 90 minutes with a nitrogen backfill to produce the second layer 134. To produce the coating of FIG. 5C, the two cathodic arc sources using a titanium deposition target are operated for about 1–4 minutes with an argon backfill to produce the first layer 132, the same sources are operated for about 30 minutes with a nitrogen backfill to produce the second layer 134, and thereafter the two cathodic arc sources using a titanium aluminide deposition target are operated for about 30 minutes with a nitrogen backfill to produce the third layer 140. In these processes, $V_{BIAS}$ is desirably about −1000 volts to deposit the first layer of titanium, and thereafter $V_{BIAS}$ is reduced to about −50 volts to deposit the remaining layers. The result is a strongly adherent coating.

The coated surface may contain some micropores in the coating. These micropores, if present, may lead to penetration of corrodants to the underlying substrate and to corrosion damage of that substrate. To seal the micropores, if present, against penetration of corrodants, the coated club head may be sealed by the application of a sealant, numeral 162. The sealant may be, for example, a solution of polytetrafluoroethylene, which penetrates into any micropores and is deposited therein. The deposited sealant lies below the general level of the wear-resistant coating, and accordingly is not worn away during use. The sealant prevents penetration of the corrodant through the micropores and to the underlying substrate.

The approach described herein was used to produce golf club heads 20 having the following top coatings: zirconium nitride (ZrN), titanium nitride (TiN), di-titanium nitride ($Ti_2N$), titanium aluminum nitride ((TiAl)N), titanium carbonitride (Ti(CN)), titanium zirconium nitride (TiZrN), and titanium aluminum carbonitride ((TiAl)(CN)). Of these combinations, the coating having layers of Ti, TiN, and Ti(CN), having an external color controllably ranging from pink to near black associated with the Ti(CN) top coating, was selected as preferred.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing a golf club component, comprising the steps of providing a golf club component substrate made of a first material being a first metal; and
   applying a coating structure to the golf club component substrate, the step of applying a coating structure including the steps of
      coating a first layer of a second material of only a second metal overlying and contacting the substrate, said second material being different than said first material, and
      coating a second layer of a third material overlying and contacting said first layer, the third material being homogeneous and including a third metal selected from a group consisting of vanadium, chromium, zirconium, titanium, niobium, molybdenum, hafnium, tantalum, and tungsten, and a nonmetal selected from a group consisting of nitrogen and carbon, wherein the second layer is not a mixture or alloy of the third material with cobalt or nickel.

2. The method of claim 1, wherein the step of applying a coating structure includes the step of
   applying the coating structure to a thickness of from about 1-½ to about 10 micrometers.

3. The method of claim 1, wherein the step of coating a first layer includes the step of
   providing a second metal selected from the group consisting of titanium and zirconium.

4. The method of claim 1, wherein the step of coating a second layer includes the step of
   depositing the third material including at least one compound selected form the group consisting of zirconium nitride, titanium nitride, di-titanium nitride, titanium aluminum nitride, titanium carbonitride, titanium zirconium nitride, and titanium aluminum carbonitride.

5. The method of claim 1, wherein the step of providing a golf club component substrate includes
   providing the golf club component substrate made of the first material selected from the group consisting of steel and titanium alloys.

6. The method of claim 1, wherein the coating structure has micropores therein, and wherein the method includes an additional step, after the step of applying a coating structure, of
   applying a sealant to an exposed surface of the coating structure so that the sealant penetrates into and is deposited within the micropores.

7. The method of claim 1, wherein the step of providing a golf club component substrate includes the step of
   providing a golf club shaft substrate.

8. The method of claim 1, wherein the step of providing a golf club component substrate includes the step of
   providing a golf club head substrate.

9. The method of claim 1, wherein the step of providing includes the step of
   providing the golf club component substrate having a substrate axis of elongation, and
   wherein the step of applying a coating structure includes the step of
   providing a deposition apparatus comprising
      at least two linear deposition sources, each of the deposition sources lying parallel to a source axis and each of the deposition sources being a source of a cationic species,
      an anion source of an anionic species reactive with the cationic species to produce a coating material,
      a substrate support adapted for rotational movement about the axis, and
      a substrate heater;
   mounting the golf club component substrate in the substrate support such that the substrate axis of elongation lies generally parallel to the source axis;
   heating the golf club component substrate to a substrate deposition temperature;
   rotating the substrate support about the source axis; and
      operating the deposition sources to deposit the respective coating material onto the golf club component substrate, the steps of heating, rotating, and operating to occur simultaneously.

10. The method of claim 9, wherein each of the deposition sources comprises a cathodic arc source.

11. The method of claim 9, wherein the step of providing a deposition apparatus includes the step of
   providing at least two deposition sources of a compound selected from the group consisting of titanium and zirconium.

12. The method of claim 1, wherein the second metal and the third metal are the same metal.

13. A golf club component, comprising
   a golf club component substrate made of a first material being a first metal and having a surface, the golf club component substrate being selected from a group consisting of a golf club shaft and a golf club head; and
   a coating structure overlying and contacting the golf club component substrate, the coating structure comprising
      a coating of a first layer of a second material of only a second metal overlying and contacting at least a portion of the surface of the club component substrate, said second material being different than said first material, and a coating of a second layer of a third material overlying and contacting said first layer, the third material being homogeneous and including a third metal selected from a group consisting of vanadium, chromium, zirconium, titanium, niobium, molybdenum, hafnium, tantalum, and tungsten, and a nonmetal selected from a group consisting of nitrogen and carbon, wherein the second layer is not a mixture or alloy of the third material with cobalt or nickel.

14. The golf club component of claim 13, wherein the third material comprises the third metal selected from the group consisting of titanium and zirconium.

15. The golf club component of claim 13, wherein the third material includes at least one compound selected from the group consisting of zirconium nitride, titanium nitride, di-titanium nitride, titanium aluminum nitride, titanium carbonitride, titanium zirconium nitride, and titanium aluminum carbonitride.

16. The golf club component of claim 13, wherein the coating structure has a thickness of from about 1-½ to about 10 micrometers.

17. The golf club component of claim 13, wherein the first material is selected from the group consisting of steel and titanium alloys.

18. The golf club component of claim 13, further including a sealant overlying the coating structure.

19. The golf club component of claim 13, wherein the second metal and the third metal are the same metal.

20. The golf club component of claim 13, wherein the coating structure further comprises a coating of a third layer of a fourth material overlying and contacting said second layer.

* * * * *